United States Patent

Sweeny et al.

[11] Patent Number: 4,660,061
[45] Date of Patent: Apr. 21, 1987

[54] INTERMEDIATE NORMAL METAL LAYERS IN SUPERCONDUCTING CIRCUITRY

[75] Inventors: Mark F. Sweeny; Meir Gershenson, both of St. Paul; David L. Fleming, Edina; Robert E. Barta, Eagan, all of Minn.

[73] Assignee: Sperry Corporation, Blue Bell, Pa.

[21] Appl. No.: 808,385

[22] Filed: Dec. 16, 1985

Related U.S. Application Data

[63] Continuation of Ser. No. 562,618, Dec. 19, 1983, abandoned.

[51] Int. Cl.$^4$ .............................................. H01L 39/22
[52] U.S. Cl. ............................................. 357/5; 357/4
[58] Field of Search .................................. 357/4, 5, 68

[56] References Cited

U.S. PATENT DOCUMENTS

| | | | |
|---|---|---|---|
| 3,391,024 | 7/1968 | Pierce | 357/5 X |
| 3,816,845 | 6/1974 | Cuomo et al. | 357/5 |
| 4,177,476 | 12/1979 | Kroger et al. | 357/5 |

OTHER PUBLICATIONS

Basavaiah, *IBM Tech. Discl. Bull;* vol. 4, No. 9, Feb. 1972.

*Primary Examiner*—Martin H. Edlow
*Attorney, Agent, or Firm*—Glenn W. Bowen

[57] ABSTRACT

A thin, nominally 150 angstroms, normal metal layer, nominally the noble normal metal palladium, sandwiched intermediate between two superconducting layers, nominally niobium, supports totally superconducting current flow therethrough such normal metal layer by the quantum mechanical tunneling effect. Such a thin normal metal layer is useful as a stop etch layer for fabrication process control, including especially the selective niobium anodization process, as an oxidation resistant or immune layer to which totally superconducting electrical contact may be reliably made such as by soldering, and as a patterned resistor in those regions of the substrate plane where such thin normal metal layer is not sandwiched by superconducting layers. Particularly concerning such stop etch function, a thin normal layer of palladium will serve as a stop etch layer to the etching of niobium while not precluding totally superconducting contact therethrough such thin palladium layer. Particularly concerning the electrical contact function, a superconducting wire, nominally niobium, may be soldered with lead-tin or indium-tin to a thin normal metal layer of palladium in the formation of a totally superconducting connection therethrough such thin palladium layer. Particularly concerning such patterned resistor, terminus superconducting sandwiches of niobium-thin palladium-niobium may be electrically resistively interconnected by such thin palladium layer precisely patterned in the region(s) wherein it is not sandwiched, only such unsandwiched region(s) of such thin palladium layer contributing controllably determinable resistance to the interconnection(s).

24 Claims, 9 Drawing Figures

INTERMEDIATE NORMAL METAL LAYERS IN SUPERCONDUCTING CIRCUITRY

This is a continuation of application Ser. No. 562,618, filed Dec. 19, 1983, now abandoned.

BACKGROUND OF THE INVENTION

The present invention relates generally to superconducting contacts to superconducting devices such as Josephson junctions, and specifically to the inclusion of a normal metal in a superconducting sandwich while maintaining superconducting contact. The invention is useful for superconducting connection of printed circuit lands having resistance to Josephson junction devices. The invention is useful for creating contact pads upon a substrate to which pads a totally superconducting, non-resistive, electrical connection, as by soldering, may be reliably made.

It is well known that normal metals, especially including the noble metal gold, may be deposited upon monolithic integrated circuitry operative at normal, non-superconducting, temperatures for the purposes of making electrical contact thereto. However, knowledge that all normal metals, including all noble metals, are, by definition, non-superconducting (i.e., "normal") precluded early attempts to utilize such normal metals, including the noble metals, as connective pads in the establishment of connections to monolithic superconducting, circuitry. Connection to superconducting circuitry upon a substrate was early made by compressively forcing a superconducting probe into contact with the superconductor of a substrate, and also by soldering using superconducting solder directly to such superconducting material upon a substrate. A problem with both the compressive connection and solder connection methods is that superconductors, such as niobium, are prone to oxidation which adversely affects the integrity of the compressive or soldered electrical interconnection thereto.

One measurement of electrical connection to superconducting circuit is shown in the article INDUCTANCE MEASUREMENTS OF SUPERCONDUCTING CHIP-TO-PACKAGE CONNECTORS SUITABLE FOR JOSEPHSON LSI TECHNOLOGY by D. C. Jones, D. J. Herrell and Y. L. Yao occurring in TEEE Transactions on Magnetics, VOL. MAG-15, NO. 1, Januray 1979. A connector is shown that bonds through an appropriate interface metallurgy (not specified, probably lead and impliedly not a noble metal because of the circuit design) a niobium pad on a superconducting chip to a similar pad on a superconducting module, the goal being the connection of such chip to such module. The bonded connection between the niobium pad upon the chip and that similar niobium pad upon the module is made by superconducting solder, forming thereby a superconducting connection. However, the connection from the niobium pads upon both the chip and the module to the etched regions (moat) on the chip—which etched regions realize the Josephson junction—is only via transmission lines of normal metal. This is because the only goal is low resistance interconnection of Josephson junctions upon a chip to superconducting transmission lines upon a module (and thence probably to another Josephson junction upon another chip), and not the creation of a totally superconductive interconnection.

The prior art emplacement of noble metal contact pads, specifically normal metal gold contact pads, upon a superconducting substrate, specifically a niobium substrate, by a combination of RF sputtering and photolithogrophy is abstracted in the report RF SPUTTERING OF GOLD CONTACTS ON NIOBIUM appearing in NASA Tech Briefs, Fall 1982, at page 104. Although the superiority of noble metal, mainly gold, contact pads in the making of reliable and stable electrical contacts to superconducting circuitry is taught, such teaching is only of the establishment of resistive, and not superconducting, contacts. Indeed, the typical utilization of normal, non-superconducting, metal even within monolithic superconducting circuitry is in the formulation of resistive interconnection between superconducting junctions or regions. Although resistive connections, including through connective pads of noble metal, can be made to superconducting circuitry through normal metal, in the prior art there exists only a hint that the presence of normal metal within a superconducting connection (which is not rendered non-superconducting thereby the presence of such normal metal) can be countenanced.

This hint arises from the construction of the Josephson junction itself wherein superconduction is obtained, via quantum mechanical tunneling, through a very, very thin layer, approximately 20 to 70 ANGSTROMS thickness, of a non-superconductor, such as silicon. It might be analogized from such a thin layer of silicon that possibly superconduction could be sustained through a very thin layer of normal metal, including the noble metals. Of course, certain questions present themselves regarding the sustaining of superconductivity through very thin normal metal layers. What geometries and/or processes might advantage themselves through such an effect? How thin must the normal metal layer be? At the required thinness of a normal metal layer is such layer thick enough to be useful, such as for a contact pad to, and through, which a totally superconducting connection may be made? What normal, and normal noble, metals are preferred?

SUMMARY OF THE INVENTION

The present invention is a method for including normal (non-superconducting) metal, preferably a noble metal, within a superconducting circuit sandwich at such thin thicknesses so that the connection to the superconducting circuit therethrough (in the vertical plane) such normal metal is superconducting, and the superconducting sandwich apparatus so formed by such method.

In accordance with the present invention, a thin normal metal layer sandwiched between superconducting layers becomes superconducting by proximity effect. This allows the inclusion of this layer while maintaining superconducting conduction through the layer. The normal metal layer can serve a number of purposes. Among these are: (1) The normal metal layer serves as a stop etch layer for fabrication process control; (2) the normal metal layer prevents oxide formation which would interfere with making superconducting contact with later layers; and (3) the normal metal layer can be patterned into resistors for conduction in the substrate plane in those regions not sandwiched by the superconducting layer.

Furthermore in accordance with the present invention, a totally superconducting electrical contact of high reliability, in particular a superconducting soldered contact, is obtained by coating the exposed refractory surface upon a substrate with a thin noble metal layer. This coating is deposited in a vacuum system on a freshly deposited or freshly back sputtered refractory metal surface. This thin noble metal coating then renders the refractory parts solderable and, if one uses a superconducting solder, superconducting contacts result.

Therefore, it is a first object of the present invention that a method should be shown whereby a normal metal layer may be emplaced between two superconductors, forming thereby a sandwich, at such thinness of said normal metal layer that the sandwich is superconducting.

It is a first subsidiary object to such first object that such a thin normal metal layer will be shown to be advantageously utilizable as a stop etch layer in the fabrication of monolithic superconducting circuitry while not interferring with superconducting current flow (which goes through the sandwich). In one particular variation, the normal metal palladium (Pd) (which metal is incidentally also a noble metal) will be shown in preferred embodiment of the invention to serve as a stop etch layer to the etching of niobium (Nb), alleviating thereby a difficult problem in selectively etching niobium (Nb) but not niobium oxide ($Nb_2O_5$). While so performing as a stop etch layer within the preferred embodiment of the invention, the thin palladium layer will not preclude superconducting contact to a superconducting Josephson junction which forms one side of the sandwich.

It is a second subsidiary object to such first object that thin normal metal layer will prevent the formation of oxide on lower, superconducting, layers when the vacuum is broken in the multi-step fabrication of monolithic superconducting circuitry. Yet when later layers are added, the thin normal metal layer does not inhibit superconducting contact to lower layers. In one preferred embodiment, a thin normal metal layer of palladium (Pd) prevents oxidation of a niobium (Nb) layer thereunder. In this preferred embodiment it is useful that palladium (Pb) is also a noble metal, itself immune to oxidation, although a noble metal is not required in realization of the second subsidiary object.

It is a third subsidiary object to such first object that the normal metal layer which is sufficiently thin so that superconduction is obtained through such layer is extendable in the plane outside of the sandwich, and thence to terminate in another sandwich or at a pad, wherein such extention, in regions of the plane not sandwiched by superconducting layers, is resistive along the exposed, unsandwiched, length of such extension. In other words, superconductivity is obtained through the thin normal metal layer while the exposed, unsandwiched, run of such thin normal metal layer in the plane suffices to produce a resistive connection between points connected in the plane equally as well as if the metal layer were, as is conventional in the prior art, much thicker. In one particular embodiment of the invention a thin normal metal layer of palladium (Pd) (which metal is incidentally also a noble metal) is used to make a resistive electrical connection between, in the first instance, the niobium (Nb) terminal of a Josephson junction and, in the second instance, a niobium (Nb) pad, which pad is further usable in making a superconducting soldered connection, and which pad is separated from such Josephson junction in the plane of the circuitry. Although the electrical connection between the two points in the plane is, as beforesaid, resistive, it should be remembered that, in accordance with the first object, any sandwich of the thin normal metal layer at either the point of the Josephson junction or of the niobium pad is superconducting through such thin normal metal layer, such superconducting current flow being in a direction perpendicular to the plane of the circuitry.

It is a second object of the present invention that noble metal pads upon a superconducting substrate, to which noble metal pads electrical connection may be reliably made as by soldering, should be sufficiently thin so that totally superconducting, non-resistive, electrical contact may be obtained through said noble metal pad, which noble metal is necessarily a normal, non-superconducting, metal. In a particular embodiment of the invention, a thin normal noble metal pad of palladium (Pd) allows of the reliable and totally superconducting connection of a niobium (Nb) superconductor under such noble metal pad to a superconducting wire soldered to such noble metal pad by a superconducting solder. Unlike the thicker normal noble metal pads of the prior art, nominally 1,000 Angstrom Gold (Au) as taught by NASA Tech Briefs for Fall 1982 at page 104, the electrical connection through the thin noble metal pad of the present invention is not resistive, but is superconducting.

DESCRIPTION OF THE PREFERRED EMBODIMENT

The present invention is concerned with the method of the insertion of normal metal layers intermediate within superconducting circuitry wherein the normal metal layers are of sufficient thinness so that superconductivity is obtained therethrough, and the superconducting circuit sandwich resultant from such method. The present invention is also concerned with the method of utilizing normal metal layers as soldered pads through which reliable electrical connection may be made to superconducting circuitry, which normal metal layers are of sufficient thinness so that such soldered connections may be entirely superconducting therethrough such normal metal; and the superconducting circuit with thin normal metal pads so created by such method.

Figure 1:
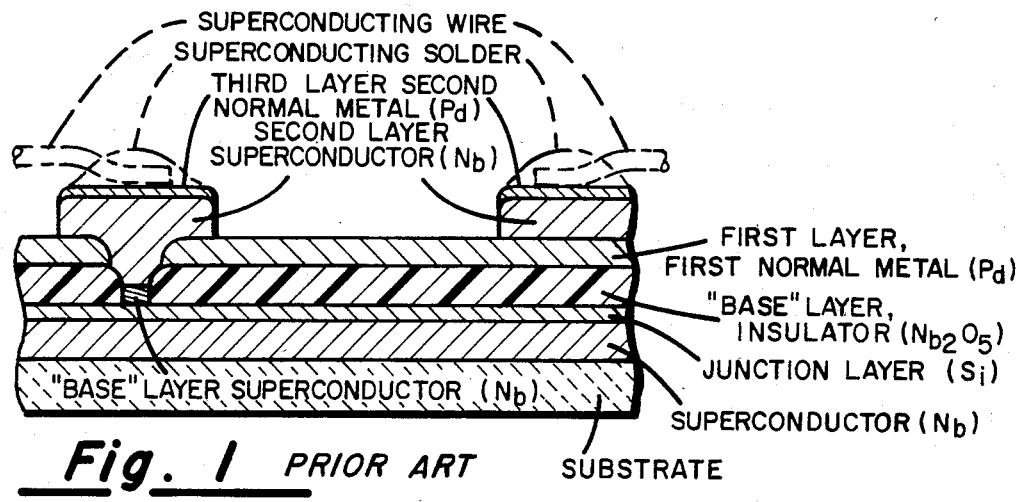
FIG. 1 shows a prior art superconducting circuit incorporating normal metal layers.

The prior art utilization of normal metal within superconducting circuitry is shown in FIG. 1. The connection of very thin normal metal layers to, and the formation of a superconducting sandwich about such thin normal metal layers, which thin normal metal layers are the subject of the present invention, may be observed in FIG. 2e. The constituent layers of the prior art superconducting circuit shown in FIG. 1 and those of the superconducting circuit of the present invention shown in FIG. 2e are substantially the same. It may, however, be immediately observed that the FIRST LAYER, FIRST NORMAL METAL (Pd) and the THIRD LAYER SECOND NORMAL METAL (Pd) both shown in FIG. 1 are illustrated at greater thickness than the counterpart FIRST LAYER, THIN FIRST NORMAL METAL (Pd) and THIRD LAYER, THIN SECOND NORMAL METAL (Pd) shown in FIG. 2e. Furthermore, the FIRST LAYER, FIRST NORMAL METAL (Pd) is etched about the region of the "BASE" LAYER SUPERCONDUCTOR (Nb) shown in FIG. 1, whereas such FIRST LAYER, THIN FIRST NORMAL METAL LAYER (Pd) is continuous over the region of such "BASE" SUPERCONDUCTOR (Nb) shown in FIG. 2e. Such continuity immediately suggests to a routineer in the superconducting circuit arts that the structure of FIG. 2e requires one less etching step, as is, in fact, the case. Furthermore, as will be discussed, only the FIRST LAYER, THIN FIRST NORMAL METAL (Pd) and the THIRD LAYER, THIN SECOND NORMAL METAL (Pd) shown in FIG. 2e are sufficiently thin so as to provide superconducting current flow therethrough. Such superconductivity through (only) the thin first normal metal layers will be seen to influence those circuits paths, and electrical connections, which are totally superconducting versus those paths, and connections, which are resistive.

Continuing with the comparison of the prior art superconducting circuit shown in FIG. 1 with the superconducting circuit of the present invention shown in FIG. 2e, within both such circuits a superconducting junction, such as a Josephson junction, is comprised of a "BASE" LAYER SUPERCONDUCTOR, normally niobium (Nb), surrounded by a "BASE" LAYER, INSULATOR, commonly niobiumpentaoxide ($Nb_2O_5$) deposited on the top of a JUNCTION LAYER, nominally silicon (Si), on top of a SUPERCONDUCTOR, nominally niobium (Nb) on top of a SUBSTRATE. The reason that the superconducting junction, nominally Pb, and the insulator, nominally $Nb_2O_5$, are called "BASE" LAYERS, is that the method and resultant structure of the present invention transpires on top of these "BASE" LAYERS. In the prior art circuit shown in FIG. 1, a normal metal, resistive, interconnection to a superconducting junction, which junction is shown as "BASE" LAYER SUPERCONDUCTOR (Nb), is made by a substantially thick layer of normal metal, shown as FIRST LAYER, FIRST NORMAL METAL (Pd), etched around the periphery of such junction and made superconducting to such junction by a second layer of superconductor, identified as SECOND LAYER, SUPERCONDUCTOR (Nb). The necessity that such a substantially thick layer of first normal metal, the FIRST LAYER, FIRST NORMAL METAL (Pd) should be etched around the region of the junction is because the SECOND LAYER, SUPERCONDUCTOR (Nb) should be conceptualized to be providing a superconducting connection in the plane perpendicular to the plane of the cross-sectional diagram of FIG. 1 to other junctions and/or structures upon the substrate. If the FIRST LAYER, FIRST NORMAL METAL (Pd) is not etched in the region of the junction, the "BASE" LAYER SUPERCONDUCTOR (Nb), then such further superconducting connection of such junction via SECOND LAYER, SUPERCONDUCTOR (Nb) is not possible.

Continuing in the prior art circuit shown in FIG. 1, resistive electrical connection to the substrate and to the junction thereon may also be made. Such a connection is made via SUPERCONDUCTING WIRE which is solderably electrically connected via SUPERCONDUCTING SOLDER to selected areas upon the substrate. These areas are normally a noble metal, nominally palladium (Pd), in order to improve the reliability of the soldered connection which is difficult to make directly to niobium (Nb) because of the tendency of such niobium to oxidize. In the region of the THIRD LAYER, SECOND NORMAL METAL (Pd) disposed directly over the "BASE" LAYER SUPERCONDUCTOR (Nb) shown in FIG. 1, the electrical connection via the SUPERCONDUCTING WIRE and SUPERCONDUCTING SOLDER is resistive to the superconducting junction and said "BASE" LAYER SUPERCONDUCTOR (Nb) by the thickness of the THIRD LAYER, SECOND NORMAL METAL (Pd). Such an electrical connection is resistive and not totally superconducting. Another resistive connection to the junction of the "BASE" LAYER SUPERCONDUCTOR (Nb) is obtained by the right-going run of the FIRST LAYER, FIRST NORMAL METAL (Pd) which is of controllably variable resistance depending upon the width and length of such run upon the plane of the SUBSTRATE, by the termination of such run within the SECOND LAYER, SUPERCONDUCTOR (Nb), and by the resistive connection through a second region of the THIRD LAYER, SECOND NORMAL METAL (Pd) to another SUPERCONDUCTING WIRE connected by SUPERCONDUCTING SOLDER. Although this electrical connection is intentionally not superconducting, being made through the resistance of the FIRST LAYER, FIRST NORMAL METAL (Pd) interconnecting the "BASE" LAYER, SUPERCONDUCTOR (Nb) to the right-most feature of the SECOND LAYER SUPERCONDUCTOR (Nb) shown in FIG. 1, the resistance encountered in the varying thickness of the THIRD LAYER, SECOND NORMAL METAL (Pd) may not be as accurately controllable as the dimensionally established resistance of the FIRST LAYER, FIRST NORMAL METAL (Pd) in its run as a stripline upon the plane of the SUBSTRATE. Thus the resistance added by the THIRD LAYER, SECOND NORMAL METAL (Pd), and the creation of a non-superconducting electrical connection, may be undesirable at the right-most location thereof such electrical connection in FIG. 1 even though such connection is already additionally, resistive to the "BASE" LAYER SUPERCONDUCTOR (Nb) junction by the stripline run of the FIRST LAYER, FIRST NORMAL METAL (Pd).

The superconducting circuit of the present invention, employing normal metal layers sufficiently thin so that superconductivity is obtained through such normal metal layers (forming thereby a superconducting sandwich about such normal metal layers) is shown in FIG. 2e. Both a first and a second layer of normal metal, nominally palladium (Pd) which is a noble metal as well as a normal metal, are deposited upon the top of one superconductor layer, nominally niobium (Nb) and below another superconducting region, either another layer of niobium (Nb) or a region of superconducting wire and solder, at sufficient thinness so that superconductivity may be obtained through such thin normal metal layers. Specifically, as illustrated in FIG. 2e, superconductivity is obtained from the "BASE" LAYER SUPERCONDUCTOR (Nb) which is part of a superconducting junction through the FIRST LAYER, THIN FIRST NORMAL METAL (Pd) disposed above such junction into the SECOND LAYER, SUPERCONDUCTOR (Nb) directly above such junction. It should be recalled that the SECOND LAYER, SUPERCONDUCTOR (Nb) disposed above such junction of "BASE" LAYER SUPERCONDUCTOR (Nb) is utilized to make electrical connection (in the direction normal to the plane of the cross-sectional diagram of FIG. 2e) to other junctions and features upon the substrate. Such electrical connection is in accordance with the present invention now made, in a totally superconducting fashion, without the necessity of etching the layer of first normal metal about the region of the "BASE" LAYER SUPERCONDUCTOR (Nb) junction. Thus, at the threshold, it should be realized that one etching step, which etching step requires the breaking of the vacuum, is saved in comparison to the prior art circuit shown in FIG. 1. Furthermore, and in momentary reference to the prior art circuit of FIG. 1, it may be noted that the required etchant to etch the FIRST LAYER, FIRST NORMAL METAL (Pd) in the region of the "BASE" LAYER SUPERCONDUCTOR (Nb) must etch niobium (Nb) but not niobium-oxide ($Nb_2O_5$). If this required etchant selectivity is not immediately clear, it may later be considered in conjunction with the teaching of applicant's FIG. 2b. This required etchant selectivity is a difficult problem. The method of the present invention overcomes this problem of finding an etchant selective for niobium.

Continuing in explanation of the finished circuit of the present invention shown in FIG. 2e, it may also be noted that the "BASE" LAYER SUPERCONDUCTOR (Nb) is connected through FIRST LAYER, THIN FIRST NORMAL METAL. (Pd) to the SECOND LAYER, SUPERCONDUCTOR (Nb) and then through the THIRD LAYER, THIN SECOND NORMAL METAL (Pd) to the SUPERCONDUCTING WIRE and SUPERCONDUCTING SOLDER (which wire and solder are shown in light line as not comprising any portion of the circuit of the present invention) through a totally superconducting pad. That is, electrical connection through the FIRST LAYER, THIN FIRST NORMAL METAL (Pd) and through the THIRD LAYER, THIN SECOND NORMAL METAL (Pd) is superconducting, despite such metals being normal meaning, by definition, non-superconducting, because of the quantum mechanical tunneling effect through such normal metal boundaries when such boundaries are sufficiently thin.

Figure 3A:
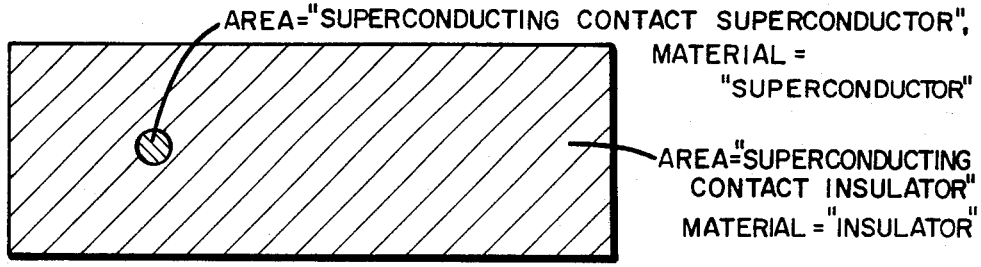
FIG. 3, consisting of FIG. 3a through FIG. 3c, shows a view, normal to the plane of the substrate upon which the superconducting circuit resides, of certain layers within the superconducting circuit incorporating intermediate thin normal metal layers of the present invention, which same superconducting circuit is shown in cross-sectional view in FIG. 2e.
Figure 3B:
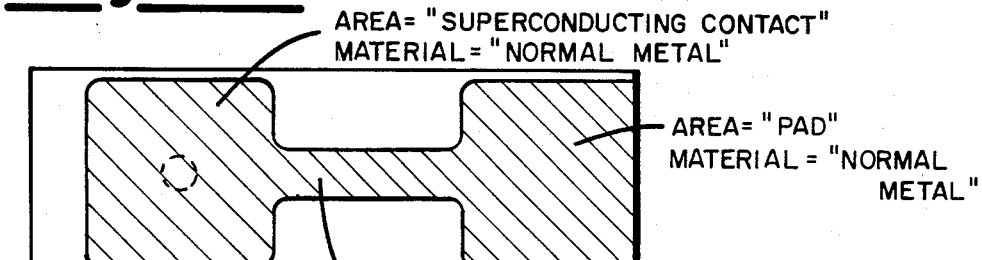

The manner by which normal metal is (conventionally) utilized to make a resistive connection to a superconducting junction is illustrated by the stripline run of the FIRST LAYER, THIN FIRST NORMAL METAL (Pd) between the left-most and the right-most areas of the SECOND LAYER, SUPERCONDUCTOR (Nb) shown in FIG. 2e. Superconducting current flow through the "BASE" LAYER SUPERCONDUCTOR (Nb) and through the FIRST LAYER, THIN FIRST NORMAL METAL (Pd) in the region wherein such FIRST LAYER, THIN FIRST NORMAL METAL (Pd) is sandwiched by the SECOND LAYER, SUPERCONDUCTOR (Nb) (which itself supports superconducting current flow) encounters resistance in the run of the stripline interconnect of the FIRST LAYER, THIN FIRST NORMAL METAL (Pd) connecting to the right-most area of SECOND LAYER, SUPERCONDUCTOR (Nb) (which area is again superconducting). The stripline interconnect of the FIRST LAYER, THIN FIRST NORMAL METAL (Pd) may be momentarily observed as the AREA="STRIPLINE", MATERIAL="NORMAL METAL" shown in FIG. 3b. Finally, electrical connection from the right-most area of SECOND LAYER, SUPERCONDUCTOR (Nb) through the right-most area of THIRD LAYER, THIN SECOND NORMAL METAL (Pd) to a SUPERCONDUCTING WIRE and SUPERCONDUCTING SOLDER (which wire and which solder are not part of the present circuit) is, as was previously true of the left-most solder connection illustrated in FIG. 2e, totally superconducting. Therefore, the current path proceeding from the "BASE" LAYER SUPERCONDUCTOR (Nb) to the right-most SUPERCONDUCTING WIRE shown in FIG. 2e is totally superconducting save for the intentional creation of a stripline area of controlled resistance in the FIRST LAYER, THIN FIRST NORMAL METAL (Pd) between the left-most and right-most regions of the SECOND LAYER, SUPERCONDUCTOR (Nb). In either the left-most or the right-most location of making superconducting soldered interconnection to the circuit of FIG. 2e, the thinness of the THIRD LAYER, THIN SECOND NORMAL METAL (Pd) supports of a non-oxidizing pad to which such soldered electrical connection may be reliably made while superconductivity is totally maintained through such paths, and through such soldered junctions.

Figure 2A:
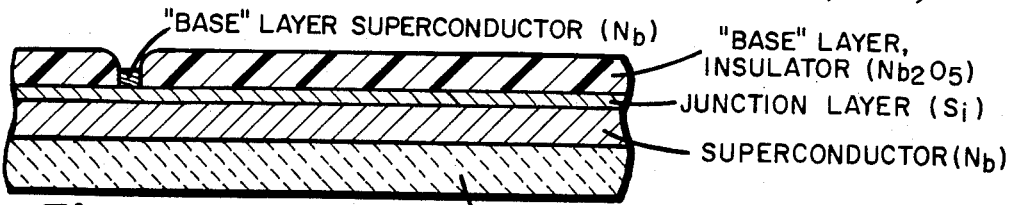
FIG. 2, consisting of FIG. 2a through FIG. 2e, shows the process of the realization of the superconducting circuit of the present invention incorporating intermediate normal metal layers sufficiently thin so that superconductivity is obtained therethrough, which final superconducting circuit is shown in FIG. 2e.

The manner of the construction of the superconducting circuit device of the present invention incorporating thin normal metal layers within a superconducting sandwich and thin normal, preferably noble, metal pads for the making of totally superconducting electrical contact to such circuit device is shown in cross-sectional views in FIG. 2a through FIG. 2d. The starting structure for the application of the method of the present invention is illustrated in FIG. 2a, the derivation of which structure is completely taught in U.S. patent application Ser. No. 197,311 to Harry Kroger entitled JOSEPHSON TUNNEL JUNCTION DEVICE AND METHOD OF MANUFACTURE, which application is assigned to Sperry Corporation, assignee of the present invention. The Kroger patent application is concerned with the creation of superconducting switching elements and gates, and particularly with an improved Josephson tunnel junction device and the method of obtaining such device by a process which is, in effect, a selective niobium anodization process. Referring to FIG. 2a, a superconducting switching element, nominally a Josephson junction device, is visible therein as the adjacent superconducting areas of the "BASE" LAYER SUPERCONDUCTOR nominally niobium, and the layer SUPERCONDUCTOR, also nominally niobium, separated by a barrier JUNCTION LAYER, nominally silicon. Within such a superconducting switching element, Josephson tunnelling current flows from one superconductor layer to the other through the barrier by the nature of the quantum mechanical Josephson tunnelling effect. Such a device is normally connected to via control line disposed adjacent the junction (not shown in FIG. 2a). Through such control line, the Josephson zero voltage direct current flowing within the device is normally controlled so as to provide the necessary current steering and control functions in the circuits realized by such Josephson junction devices.

For the sake of completeness, the manner of the realization of the structure shown in FIG. 2a in accordance with the teaching of U.S. patent application Ser. No. 179,311 for JOSEPHSON TUNNEL JUNCTION DEVICE AND METHOD OF MANUFACTURE to Kroger will be summarized. The SUBSTRATE may consist of detailed elements (not shown) including an external layer of oxidized silicon, and intermediate layer of refractory superconductor material such as niobium, and an insulating layer which ultimately interfaces with the superconducting transmission line layer SUPERCONDUCTOR, nominally niobium, in the usual manner. The manner by which such a SUBSTRATE may be composed of detailed elements in layers (not shown) starts with a base, or external layer, of crystaline silicon with an oxidized surface. Next is deposited upon this oxide surface a layer of 1,000 to 5,000 angstroms thick of a superconductor, nominally niobium, by a conventional sputtering process, which superconducting layer serves as a transmission line ground plane layer. Finally, a silicon-dioxide or amorphous silicon dielectric layer is finally formed at depth of 1,000 to 20,000 angstroms. In this manner, the SUBSTRATE shown in FIG. 2a is prepared to accept a particular Josephson device configuration upon its surface, which first surface layer thereto is the SUPERCONDUCTOR, nominally niobium, which is generally not patterned in accordance with the Kroger invention, nor is such patterned in the further utilization of such structure according to the present invention. The SUPERCONDUCTING LAYER is nominally niobium sputter deposited in a usual manner to a depth of 2,000 to 3,000 angstroms.

Continuing in the summary explanation of the Kroger method for obtaining the superconducting structure shown in FIG. 2a, the JUNCTION LAYER, nominally silicon, is created as a 30 to 400 angstroms thick tunnelling barrier layer by sputter deposition in the same vacuum chamber, and without inturruption, to the aforementioned sputter-deposit of the SUPERCONDUCTOR LAYER. Such layer is composed of amorphous silicon, or other amorphous elements, such as germanium. No patterning of the JUNCTION LAYER is taken either within the Kroeger method or within the subsequent utilization of such layer within the structure of the present invention. Next, and as a step preferably performed within the same vacuum chamber, a layer 200-to 400 angstroms thick of a refractory superconductor, such as niobium, is next deposited either by electron beam evaporation or by sputter deposition at a 20 microtorrs pressure of argon. This layer of niobium will serve as the counter electrode with respect to the barrier of the JUNCTION LAYER, and is made relatively thin so that portions thereof may be subsequently completely anodized or oxidized in accordance with the Kroger method. Such anodization, or oxidation, is taken in accordance with the Kroger method by the application, exposure, and development of a conventional photoresist layer next applied to the surface of the superconductor. In the illustration of FIG. 2a, the area of this protective photo resist pattern is that area shown to be occupied by "BASE" LAYER SUPERCONDUCTOR. By such photo resist patterning, the isolated active Josephson barriers are formed. Next, the refractory superconductor, niobium, layer is oxidized in the region not protected by the photo resist by a conventional process, such as via a solution of ammonium pentaborate and ethylene glycol in water with the niobium serving as an anode, the cathode being platinum (Pt). During anodization, the niobium layer grows somewhat thicker, as from nominally 7 to nominally 20 angstroms, while being converted entirely to niobium-oxide, such as is finally illustrated in FIG. 2b as layer "BASE" LAYER INSULATOR. Finally, the photo resist island is removed, leaving the area shown in FIG. 2a as "BASE" LAYER SUPERCONDUCTOR. The reason that the top-most layers within the diagram of FIG. 2a are called "BASE" LAYERS is because the method and the resultant circuit structure of the present invention will transpire entirely upon the top of such layers.

The manner of deriving the present invention incorporating thin normal metal layer sandwiched intermediary superconducting circuits by proceeding from the prior art structure shown in FIG. 2a is shown in FIG. 2b through FIG. 2e. Referencing FIG. 2b, a FIRST LAYER, THIN FIRST NORMAL METAL, nominally palladium (Pd), is first deposited by electron beam evaporation or by sputter deposition at a thickness of approximately 150 angstroms. Normally without breaking vacuum, a next SECOND LAYER, SUPERCONDUCTOR of a fractory superconductor, nominally niobium (Nb), is deposited also by electron beam evaporation or by sputter deposition to a thickness of 200 to 400 angstroms. Finally, and also normally without breaking vacuum, a THIRD LAYER, THIN SECOND NORMAL METAL is deposited at approximately 150 angstroms thickness of normal metal, nominally a noble normal metal, nominally palladium (Pd). The FIRST LAYER, THIN FIRST NORMAL METAL and the THIRD LAYER, THIN SECOND NORMAL METAL need not be comprised of the same normal metal, nor of a noble normal metal. However, and by momentary reference to the finished superconducting circuit shown in FIG. 2e, it may be observed that the THIRD LAYER, THIN SECOND NORMAL METAL is the layer to which electrical connection, nominally superconductingly soldered electrical connection, may be made to the superconducting circuit of the present invention. Consequently, it is desirable that such THIRD LAYER, THIN SECOND NORMAL METAL should be a noble metal in order that the pads to be formed of such layer to which electrical connection may later be made are not subject to oxidation, and may reliably support such electrical connection.

Figure 3C:
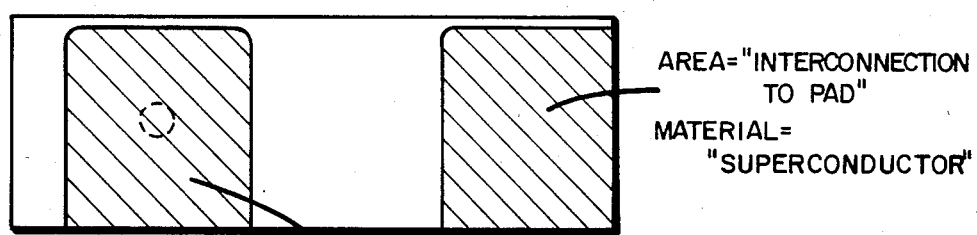
Figure 2B:
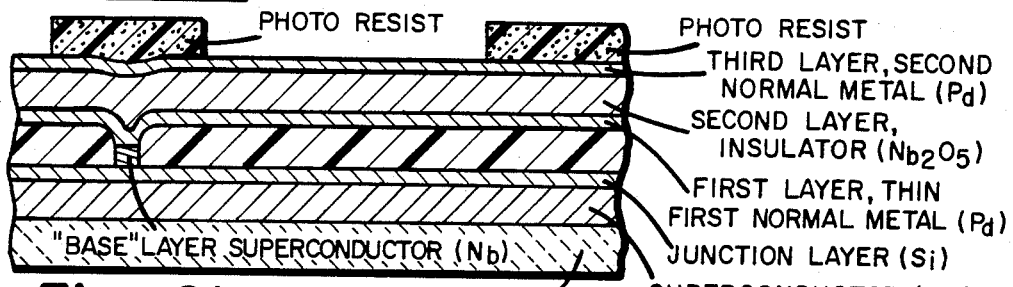

Continuing in FIG. 2b, areas of PHOTO RESIST are applied by the process of spinning in order to define the areas of superconducting transmission line, which superconducting transmission line will be formed of the material SECOND LAYER, SUPERCONDUCTOR. The areas defined by the PHOTO RESIST visible in FIG. 2b may be momentarily observed in FIG. 3c as AREA="INTERCONNECTION TO SUPERCONDUCTING CONTACT" and AREA="INTERCONNECTION TO PAD". It may be noted that the AREA="INTERCONNECTION TO SUPERCONDUCTING CONTACT" visible in FIG. 3c is approximately juxtaposed over the AREA="SUPERCONDUCTING CONTACT SUPERCONDUCTOR" visible in FIG. 3a, which area is dashed-line outlined within FIG. 3c and which area is located, in cross-sectional view, by the "BASE" LAYER SUPERCONDUCTOR shown in FIG. 2b. The teaching of using PHOTO RESIST in creating the transmission line patterns shown in FIG. 2b, and the suggested areas of such photo resist shown in FIG. 3c, is to show that the structures being defined will be superconductingly interconnective, via superconducting transmission line to other, further, features of other superconducting circuits upon the substrate. Thus, by momentary reference ahead to FIGS. 2c through 2e, it must be envisioned that the SECOND LAYER SUPERCONDUCTOR shown in cross-sectional view therein said figures does extend in the plane perpendicular to such figures, and does establish superconducting transmission line interconnection between various elements of superconducting circuitry. Continuing to momentarily reference ahead to FIG. 2c through FIG. 2e, and recognizing that the SECOND LAYER SUPERCONDUCTOR is part of superconducting transmission line interconnection, such as is normal in the art, the phenomena of note, and a prime aspect of the present invention, is that such SECOND LAYER SUPERCONDUCTOR transmission line will be separated from circuit elements and regions superconductingly interconnected, such as the "BASE" LAYER SUPERCONDUCTOR, by the FIRST LAYER, THIN FIRST NORMAL METAL. Continuing in how this is accomplished, the PHOTO RESIST shown in FIG. 2b is next exposed and developed.

Figure 2C:
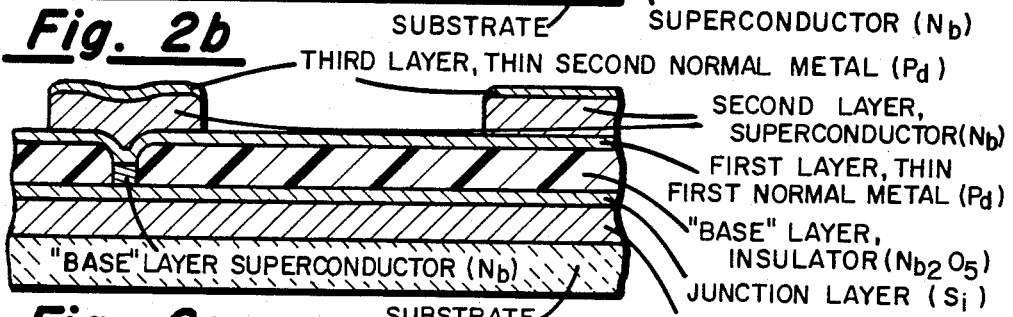

Progressing in the explanation of the process of the present invention in manufacturing superconducting circuitry incorporating thin normal metal layers, the structure of FIG. 2c is obtained in three steps applied to the structure of FIG. 2b. First, the THIRD LAYER, SECOND NORMAL METAL is etched, or removed, in the areas not protected by the PHOTO RESIST (shown in FIG. 2b) by an etchant, normally the palladium etchant of aqua regia when such THIRD LAYER, SECOND NORMAL METAL is palladium. Next, the SECOND LAYER, SUPERCONDUCTOR is also etched, or removed, in the regions not protected by the PHOTO RESIST (shown in FIG. 2b) by an etchant of such superconductor, nominally by the plasma etching of niobium in a standard atmosphere of carbon-tetraflouride mixed with oxygen. Such plasma etching does not affect, and is cleanly stopped by, the FIRST LAYER, THIN FIRST NORMAL METAL which is nominally palladium. Finally, the PHOTO RESIST (shown in FIG. 2b) is removed, resulting in the circuit structure shown in FIG. 2c.

Of note, certain significant process differences are already detectable in the steps leading to the circuit structure of FIG. 2c from those which led to the prior art circuit structure shown in FIG. 1. Firstly, it may be noted that the "BASE" LAYER SUPERCONDUCTOR, shown in FIG. 1 and FIG. 2a through FIG. 2c discussed to this point, has been totally protected during the steps of the present invention shown in FIG. 2a through FIG. 2c. This protection against all subsequent chemical and/or other treatment of the wafer is important as for preserving the purity of the active barrier region and protecting it against damage, such active barrier region being, as aforementioned, of only approximately seven angstroms thickness. Furthermore, in the production of the circuit of FIG. 2c by the method of the present invention an intermediate etching step has been eliminated from the method of producing the prior art circuit shown in FIG. 1. Furthermore, the presence of the FIRST LAYER, THIN FIRST NORMAL METAL over the entire surface of the wafer has, in the process of the present invention shown in FIG. 2a through FIG. 2c, eliminated the difficult search for an etchant which etches niobium (Nb) but not niobiumpentaoxide ($Nb_2O_5$). The patterning of this FIRST LAYER, THIN FIRST NORMAL METAL represents the final steps of the present invention, shown in FIG. 2d and FIG. 2e.

Figure 2D:
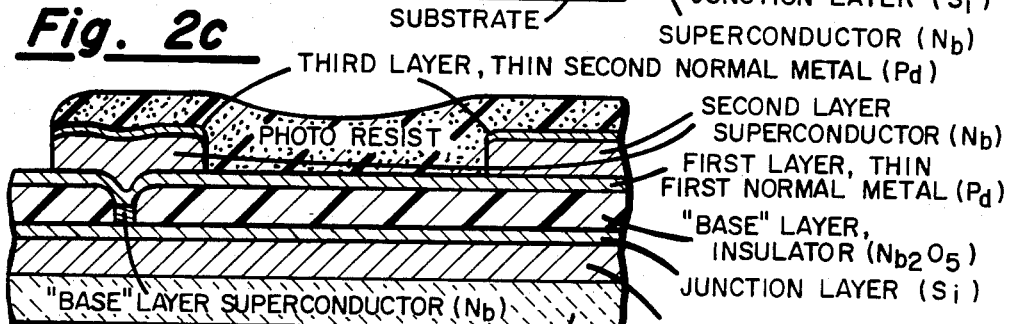
Figure 2E:
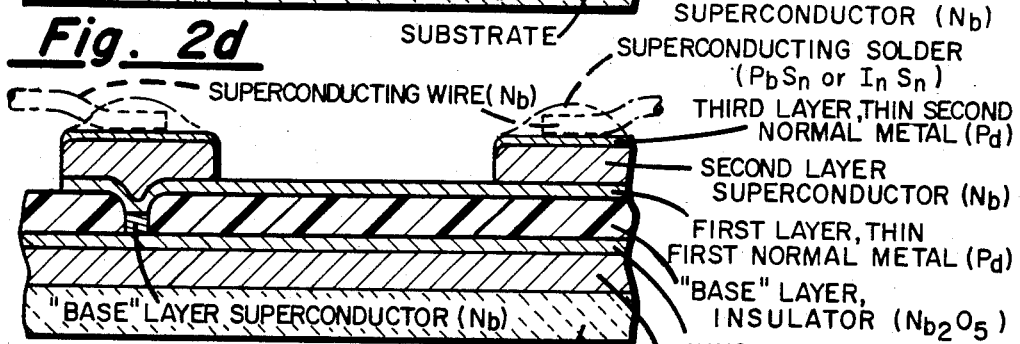

Continuing in the explanation of the process of the present invention to FIG. 2d, new PHOTO RESIST is patterned between the left area of SECOND LAYER, SUPERCONDUCTOR (which area is juxtaposed over the "BASE" LAYER SUPERCONDUCTOR) and the right area of SECOND LAYER, SUPERCONDUCTOR (which area will serve as one side of a superconducting sandwich formed about the THIRD LAYER, THIN SECOND NORMAL METAL in the formation of a superconducting interconnection to a pad). This pattern of the PHOTO RESIST shown in FIG. 2d may be observed in FIG. 3b. The pattern of PHOTO RESIST is protecting the area of "SUPERCONDUCTING CONTACT" and the area of "PAD" while defining a transmission line interconnect therebetween, which transmission line area is called "STRIPLINE". Returning to FIG. 2d, the interconnective "STRIPLINE" which is being patterned is of the material FIRST LAYER, THIN FIRST NORMAL METAL.

Therefore, and in the production of the final circuit structure of FIG. 2e from the circuit structure of FIG. 2d, the FIRST LAYER, THIN FIRST NORMAL METAL is etched, nominally by the palladium etchant of aqua regia when such first layer is, as is preferred, comprised of palladium. Without more, the pads of superconducting and resistive interconnect which have been established in the circuit structure of FIG. 2e are as follows. There is superconducting connection from the layer of SUPERCONDUCTOR through the JUNCTION LAYER to the "BASE" LAYER SUPERCONDUCTOR, which superconducting interconnection through the thin, nominally 7 angstrom, JUNCTION LAYER (which is normally silicon) forms a Josephson junction device. There is further superconducting interconnection from the entirety of the "BASE" LAYER SUPERCONDUCTOR through the FIRST LAYER, THIN FIRST NORMAL METAL which is entirely juxtaposed above the area of such "BASE" LAYER SUPERCONDUCTOR, into the SECOND LAYER, SUPERCONDUCTOR which forms a superconducting transmission line in the area of, and interconnective to, such "BASE" LAYER, SUPERCONDUCTOR. The FIRST LAYER, THIN FIRST NORMAL METAL, of approximately 150 angstroms thickness is no obstacle to superconductivity through the sandwich consisting of the "BASE" LAYER SUPERCONDUCTOR, the FIRST LAYER, THIN FIRST NORMAL METAL, and the SECOND LAYER, SUPERCONDUCTOR. As before mentioned, it may be envisioned that the SECOND LAYER, SUPERCONDUCTOR excurs in the plane perpendicular to the plane of the diagram of FIG. 2e to make superconducting interconnection to further circuit structures upon the SUBSTRATE. At least one further, resistive, interconnection to the the "BASE" LAYER SUPERCONDUCTOR is additionally shown in FIG. 2e with reference to FIG. 3b. This resistive, non-superconducting, connection is from the region of the SECOND LAYER, SUPERCONDUCTOR juxtaposed over the area of the "BASE" LAYER SUPERCONDUCTOR (with which such SECOND LAYER, SUPERCONDUCTOR the "BASE" LAYER SUPERCONDUCTOR is superconducting) through the patterned, "STRIP-LINE" (shown in FIG. 3b) area of the FIRST LAYER, THIN FIRST NORMAL METAL, to the SECOND LAYER, SUPERCONDUCTOR in the area of the "PAD" (shown in FIG. 3b). Of course, this resistive interconnection pattern formed at the FIRST LAYER, THIN FIRST NORMAL METAL need not have terminated in an area described as a "PAD", which area will subsequently serve for electrical interconnection, but could be a resistive interconnection to further superconducting junctions, elements, or circuit features.

As a final, alternative, utilization of normal metal layers sufficiently thin so as to enable superconductivity therethrough within superconducting circuitry, the superconducting circuit apparatus of the present invention shown in FIG. 2e shows how superconducting electrical connection, nominally soldered electrical connection, may be made through a THIRD LAYER, THIN SECOND NORMAL METAL. Such electrical connection is readily and reliably made by SUPERCONDUCTING WIRE, nominally niobium (Nb) soldered in connection to the THIRD LAYER, THIN SECOND NORMAL METAL, nominally palladium (Pd) by SUPERCONDUCTING SOLDER, nominally lead-tin (PbSn) or indium-tin (InSn). All such SUPERCONDUCTING WIRE and SUPERCONDUCTING SOLDER is shown in light line in FIG. 2e for not being part of the actual circuit structure of the present invention. In both potential sites of soldered interconnect, only one of which would normally be used depending upon whether a totally superconducting or a resistive connection to the Josephson junction is desired for the total path, the SUPERCONDUCTING WIRE and SUPERCONDUCTING SOLDER makes superconducting connection to the SECOND LAYER, SUPERCONDUCTOR completely through the THIRD LAYER, THIN SECOND NORMAL METAL sandwiched therebetween. Of course, by making such superconducting contact, the SUPERCONDUCTING WIRE at the left of the circuit of FIG. 2e is in completely superconducting contact with the "BASE" LAYER SUPERCONDUCTOR of the Josephson junction device. This completely superconducting contact is maintained through two layers of thin normal metal, the FIRST LAYER, THIN FIRST NORMAL METAL and the THIRD LAYER, THIN SECOND NORMAL METAL in the area of the "SUPERCONDUCTING CONTACT" (shown in FIG. 3b). Of course, even though the connection between the rightmost SUPERCONDUCTING WIRE shown in FIG. 2e to the SECOND LAYER SUPERCONDUCTOR in the area of the "PAD" (shown) in FIG. 3b thereunder is completely superconducting, such right-most SUPERCONDUCTING WIRE is still, by length of the resistive "STRIPLINE" (shown in FIG. 3b) patterned upon the FIRST LAYER, THIN FIRST NORMAL METAL, in resistive contact with the "BASE" LAYER SUPERCONDUCTOR of the Josephson junction device. It is deemed advisable to utilize completely superconducting soldered contacts as are taught by the present invention even when resistive contact to superconducting circuitry is desired because the patterning of such resistances as is taken in the steps between FIG. 2d FIG. 2e is more uniform, and precise of the resistance created than is resistive connection through thick, resistive, normal metal pads.

While the invention has been described in its preferred embodiment permitting of the use of thin intermediate normal metal layers in the regions of superconducting junctions and pads, it is to be understood that the words which have been used are words of description rather than of limitation and that changes may be made within the purview of the dependent claims without departing from the true scope and spirit of the invention in its broader aspects. In particular, the teaching of the present invention that a normal metal layer, with all its attending utility as a stop layer to further process steps in the creation of superconducting circuitry, may be deposited upon superconductors without precluding that totally superconducting contact may be subsequently made to such superconductors completely through such thin normal metal layers, forming thereby a superconducting sandwich, does show a general method and apparatus of utility to the practioner of the art of generating superconducting circuitry.

What is claimed is:

1. In a superconducting device comprising a first superconducting layer, a junction layer on said first superconducting layer, an insulating layer on said first superconducting layer, at least one superconducting area on said junction layer surrounded by said insulator layer, superconducting connector pad means disposed over said superconducting area, and superconducting wire means electrically connected to said superconducting connector pad means, the improvement comprising a first metal layer disposed over said insulator layer and intermediate said superconducting area and said connector pad means and a second metal layer disposed between said connector pad means and said superconductor wire means wherein said first metal layer covers said superconducting area and said first and second metal layers are sufficiently thin to allow quantum mechanical tunneling between said connector pad means and said superconducting area and said connector pad means and said superconducting wire means, respectively.

2. In a superconducting device as claimed in claim 1 the further improvement wherein said metal layers are each 150 angstroms, or less, in thickness.

3. In a superconducting device as claimed in claim 1 the improvement wherein said metal layers are noble metal layers.

4. In a superconducting device as claimed in claim 3 the further improvement wherein said metal layers are each 150 angstroms, or less, in thickness.

5. In a superconducting device as claimed in claim 4 the further improvement wherein said noble metal is palladium.

6. In a superconducting device as claimed in claim 1 the further improvement wherein said first metal layer is configured to form as stripline connection between a plurality of connector pad means.

7. In a superconducting device as claimed in claim 5 the further improvement wherein said first metal layer is 150 angstroms, or less, in thickness.

8. In a superconducting device as claimed in claim 5 the improvement wherein said first metal layer is a noble metal layer.

9. In a superconducting device as claimed in claim 8 the further improvement wherein said noble metal is palladium.

10. In a superconducting device comprising at least one superconducting connector pad means, superconducting wire means electrically connected to said connector pad means and a metal layer intermediate said connector pad means and said superconducting wire means, the improvement wherein said metal layer is sufficiently thin to allow quantum mechanical tunneling between said connector pad means and said superconducting wire means.

11. In a superconducting device as claimed in claim 10 the further improvement wherein said metal layer is 150 angstroms, or less, in thickness.

12. In a superconducting device as claimed in claim 10 the improvement wherein said metal layer is a noble metal layer.

13. In a superconducting device as claimed in claim 12 the further improvement wherein said metal layer is 150 angstroms, or less, in thickness.

14. In a superconducting device as claimed in claim 13 the further improvement wherein said noble metal is palladium.

15. In a superconducting device comprising at least one superconducting connector pad means and a superconducting area means the improvement comprising a metal layer intermediate said connector pad means and said superconducting area wherein said metal layer covers said superconducting area and is sufficiently thin to allow quantum mechanical tunneling between said connector pad means and said superconducting area.

16. In a superconducting device as claimed in claim 15 the further improvement wherein said metal layer is 150 angstroms, or less, in thickness.

17. In a superconducting device as claimed in claim 15 the improvement wherein said metal layer is a noble metal layer.

18. In a superconducting device as claimed in claim 17 the further improvement wherein said metal layer is 150 angstroms, or less, in thickness.

19. In a superconducting device as claimed in claim 18 the further improvement wherein said noble metal is palladium.

20. In a superconducting device comprising at least one superconducting pad means, at least one superconducting area and superconducting wire means the improvement comprising a first metal layer intermediate said connector pad means and said superconducting area and a second metal layer intermediate said connector pad means and said superconducting wire means wherein said first and second metal layers are sufficiently thin to allow quantum mechanical tunneling between said connector pad means and said superconducting area in a first direction and between said superconducting wire means in a second direction.

21. In a superconducting device as claimed in claim 20 the further improvement wherein said metal layers are each 150 angstroms, or less, in thickness.

22. In a superconducting device as claimed in claim 20 the improvement wherein said metal layers are noble metal layers.

23. In a superconducting device as claimed in claim 22 the further improvement wherein said metal layers are each 150 angstroms, or less, in thickness.

24. In a superconducting device as claimed in claim 23 the further improvement wherein said noble metal is palladium.

* * * * *